United States Patent
Shih et al.

(10) Patent No.: US 8,671,305 B1
(45) Date of Patent: Mar. 11, 2014

(54) TECHNIQUES FOR ADJUSTING PERIODIC SIGNALS BASED ON DATA DETECTION

(75) Inventors: Shou-Po Shih, Cupertino, CA (US); Tim Tri Hoang, San Jose, CA (US); Kazi Asaduzzaman, Fremont, CA (US)

(73) Assignee: Altera Corporation, San Jose, CA (US)

( * ) Notice: Subject to any disclaimer, the term of this patent is extended or adjusted under 35 U.S.C. 154(b) by 374 days.

(21) Appl. No.: 13/175,604

(22) Filed: Jul. 1, 2011

(51) Int. Cl.
*G06F 1/04* (2006.01)
*G06F 1/12* (2006.01)

(52) U.S. Cl.
USPC .......................... 713/600; 713/400; 713/503

(58) Field of Classification Search
USPC ........................................ 713/400, 503, 600
See application file for complete search history.

(56) References Cited

U.S. PATENT DOCUMENTS

| | | | |
|---|---|---|---|
| 6,683,930 B1 * | 1/2004 | Dalmia | 375/376 |
| 6,741,668 B1 * | 5/2004 | Nakamura | 375/376 |
| 7,089,444 B1 * | 8/2006 | Asaduzzaman et al. | 713/600 |
| 8,559,582 B2 * | 10/2013 | Hoang | 375/376 |
| 2010/0241918 A1 * | 9/2010 | Nedovic | 714/746 |

OTHER PUBLICATIONS

"Burst-mode CDR Circuit Using a ΔΣ D/A Converter for 10G-EPON Systems," NTT Microsystem Integration Laboratories, NTT Access Network Service Systems Laboratories, 2008.
Julien Faucher, et al., "622/1244 Mb/s Burst-Mode CDR for GPONs," IEEE, 2006, pp. 420-421.
Sander L.J. Gierkink, "A 2.5Gb/s Burst-Mode CDR based on a 1/8th rate Dual Pulse Ring Oscillator," Custom Integrated Circuits Conference, 2007. CICC '07, IEEE, Sep. 16-19, 2007, pp. 357-360.
Pyung-Su Han, et al., "1 Gb/s gated-oscillator burst mode CDR for half-rate clock recovery," Journal of Semiconductor Technology and Science, vol. 4, No. 4, Dec. 2004, pp. 275-279.
Masafumi Nogawa, et al., "A 10Gb/s Burst-Mode CDR IC in 0.13μm CMOS," 2005 IEEE International Solid-State Circuits Conference, Session 12, Optical Communications, 2005, pp. 228-229, 595.

* cited by examiner

*Primary Examiner* — Mark Connolly
(74) *Attorney, Agent, or Firm* — Steven J. Cahill (57) ABSTRACT

A circuit includes a phase detector circuit, a phase frequency detector circuit, a data detection circuit, a multiplexer circuit, and a clock signal generation circuit. The phase detector circuit is operable to generate a first phase detection signal based on a data signal and a first periodic signal. The phase frequency detector circuit is operable to generate a second phase detection signal based on second and third periodic signals. The data detection circuit is operable to generate a data detection signal based on the first phase detection signal. A multiplexer circuit is operable to provide one of the first and the second phase detection signals as a selected signal based on the data detection signal. The periodic signal generation circuit is operable to cause adjustments to phases of the first and the second periodic signals based on the selected signal.

21 Claims, 8 Drawing Sheets

TECHNIQUES FOR ADJUSTING PERIODIC SIGNALS BASED ON DATA DETECTION

TECHNICAL FIELD

The present invention relates to electronic circuits, and more particularly, to techniques for adjusting periodic signals based on data detection.

BACKGROUND

A passive optical network (PON) is a point-to-multipoint network architecture that enables a single optical fiber to serve multiple premises using passive, unpowered optical splitters. The GPON (gigabit passive optical network) standard differs from other PON standards in that it achieves higher bandwidth and higher efficiency using larger, variable-length packets of data.

A GPON network includes a central office node referred to as an optical line terminal (OLT), user nodes referred to as optical network units (ONUs), and optical fibers and optical splitters coupled between the OLT and the ONUs. In a GPON network, the transmission modes for downstream (i.e., from OLT to ONU) and upstream (i.e., from ONU to OLT) are different. For the downstream transmission, the OLT broadcasts data signals to the ONUs in continuous mode in which the downstream channel has continuous data signals. However, in the upstream channel, ONUs do not transmit data signals in continuous mode. Using continuous mode in the upstream channel would cause all of the data signals transmitted from the ONUs to converge into one fiber and overlap.

To solve this problem, burst mode transmission is used for the upstream channel in GPON networks. In burst mode transmission, an ONU only transmits data when it is allocated a time slot, and all of the ONUs share the upstream channel using time division multiplexing (TDM). Because data signals are transmitted to the OLT without an accompanying clock signal, a clock and data recovery (CDR) circuit in a receiver at the OLT generates a clock signal from an approximate frequency reference signal and then phase-aligns the clock signal to the transitions in the input data signal. The clock signal is then used to sample data in the input data signal.

The Stratix® IV GX field programmable gate array (FPGA) manufactured by Altera Corporation of San Jose, Calif., includes a clock data recovery (CDR) circuit that functions in two modes. The two modes are lock-to-data mode and lock-to-reference mode. In lock-to-data mode, the CDR circuit adjusts the phases of its output clock signals based on the phase of the input data signal. In lock-to-reference mode, the CDR circuit adjusts the phases and frequencies of its output clock signals based on the phase and the frequency of a reference clock signal.

In burst mode transmission, the input data signal does not contain data during dead times. When the input data signal contains data, the CDR circuit functions in lock-to-data mode. The CDR circuit remains in lock-to-data mode during the dead time if the dead time is short (i.e., less than 125 nanoseconds), but the frequencies of the output clock signals generated by the CDR circuit do not change enough to impact performance.

If the dead time is long (i.e., greater than 250 nanoseconds), the CDR circuit switches from lock-to-data mode to lock-to-reference mode during the dead time. In the lock-to-reference mode, the CDR circuit has enough time to align the phase and frequency of a feedback clock signal with the phase and frequency of the reference clock signal. When the input data signal contains data after the dead time, the CDR circuit switches back to lock-to-data mode.

If the dead time has an intermediate duration (i.e., between 125 and 250 nanoseconds), the CDR circuit either does not switch to lock-to-reference mode or does not switch to lock-to-reference mode for long enough to allow the CDR circuit to align the phase and frequency of the feedback clock signal with the phase and frequency of the reference clock signal. During a dead time having an intermediate duration, the phases and frequencies of the output clock signals of the CDR circuit drift away from desired values.

Figure 1:
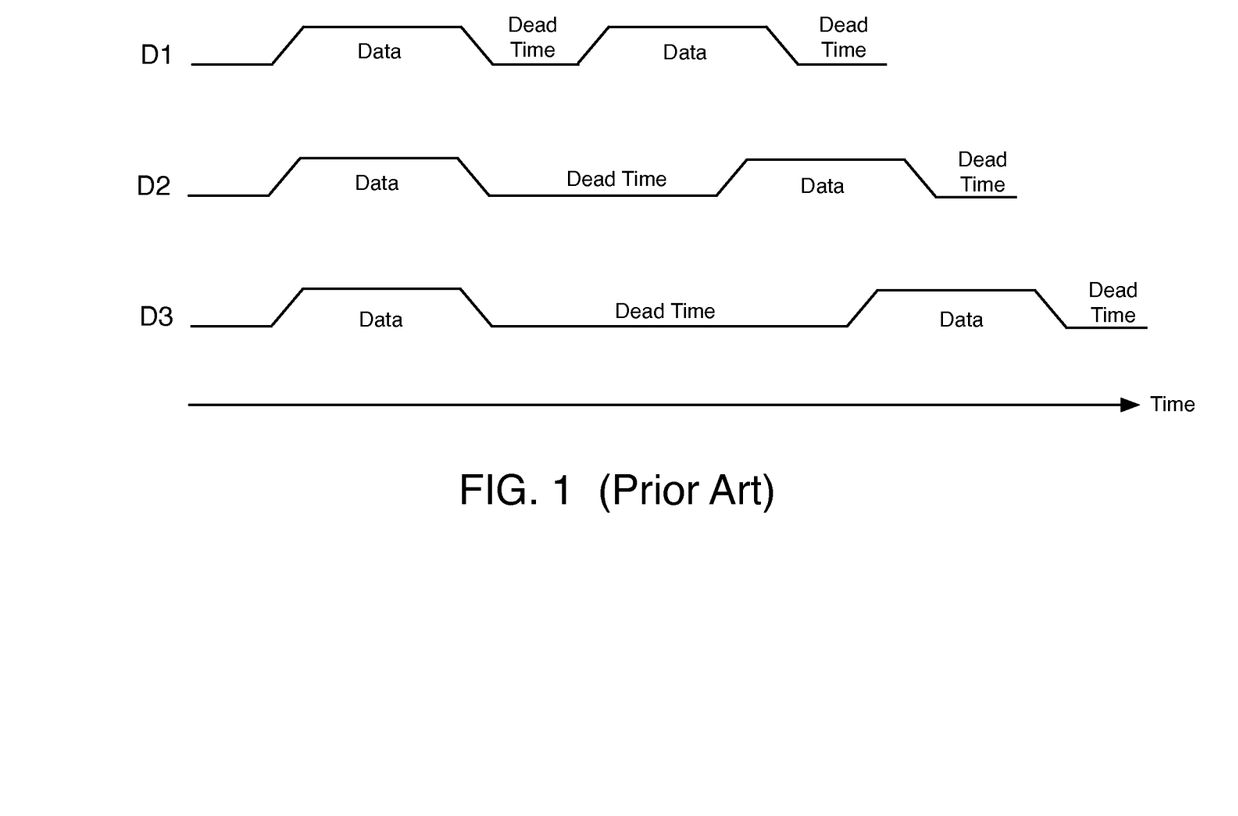
FIG. 1 is a timing diagram that illustrates simplified examples of waveforms of input data signals with dead times that have short, intermediate, and long durations, respectively.

FIG. 1 is a timing diagram that illustrates simplified examples of waveforms of input data signals D1, D2, and D3 with dead times that have short, intermediate, and long durations, respectively. The input data signals D1, D2, and D3 are transmitted to a CDR circuit in burst mode transmission such that periods of data in each of the data signals are separated by dead times. The data signals D1, D2, and D3 do not contain data during the dead times.

BRIEF SUMMARY

According to some embodiments, a circuit includes a phase detector circuit, a phase frequency detector circuit, a data detection circuit, a multiplexer circuit, and a clock signal generation circuit. The phase detector circuit is operable to generate a first phase detection signal based on a data signal and a first periodic signal. The phase frequency detector circuit is operable to generate a second phase detection signal based on second and third periodic signals. The data detection circuit is operable to generate a data detection signal based on the first phase detection signal. A multiplexer circuit is operable to provide one of the first and the second phase detection signals as a selected signal based on the data detection signal. The periodic signal generation circuit is operable to cause adjustments to phases of the first and the second periodic signals based on the selected signal.

Various objects, features, and advantages of the present invention will become apparent upon consideration of the following detailed description and the accompanying drawings.

DETAILED DESCRIPTION

Figure 2:
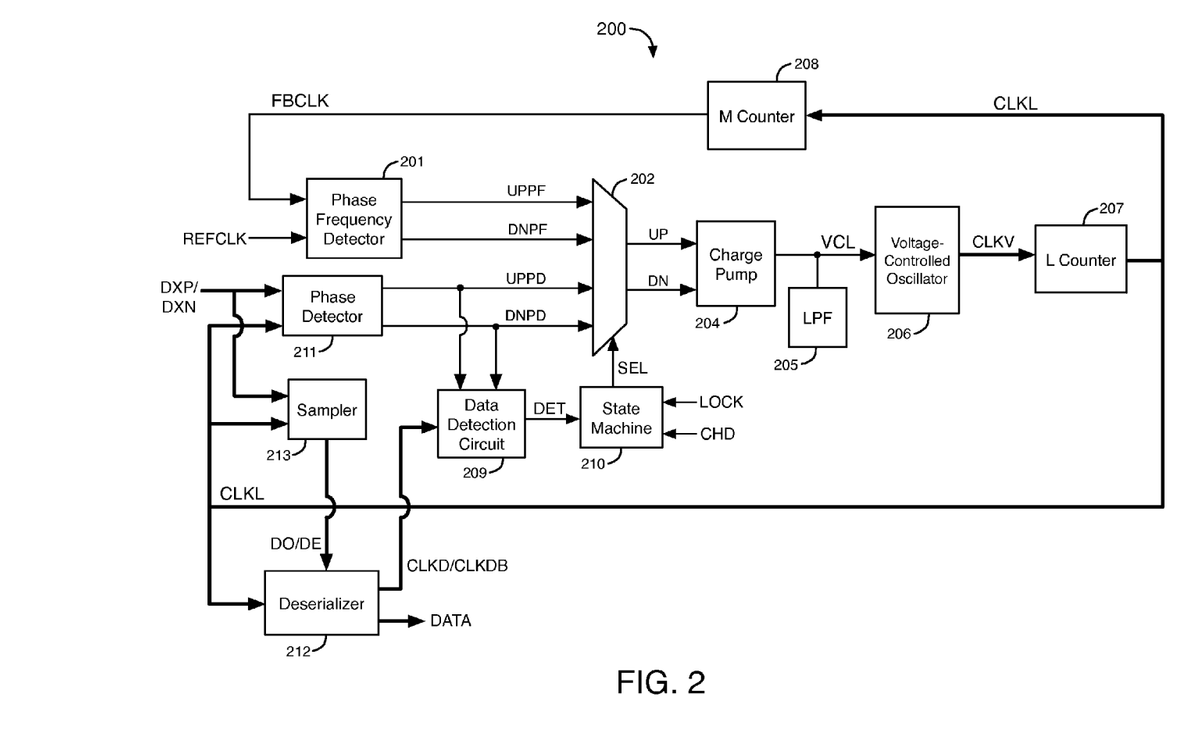
FIG. 2 illustrates an example of a clock data recovery (CDR) circuit, according to an embodiment of the present invention.

FIG. 2 illustrates an example of a clock data recovery (CDR) circuit 200, according to an embodiment of the present invention. CDR circuit 200 is operable to detect data in an input data signal using a data detection circuit. CDR circuit 200 switches between a lock-to-reference mode and a lock-to-data mode based on whether data is detected in the input data signal. CDR circuit 200 is operable to function according to a GPON (gigabit passive optical network) data transmission standard by switching between the lock-to-data and lock-to-reference modes based on whether the data detection circuit detects data in the input data signal.

CDR circuit 200 includes a phase frequency detector (PFD) circuit 201, multiplexer circuits 202, charge pump circuit 204, low pass filter (LPF) circuit 205, voltage-controlled oscillator (VCO) circuit 206, L counter circuit 207, M counter circuit 208, data detection circuit 209, state machine 210, phase detector circuit 211, deserializer circuit 212, and sampler circuit 213. State machine 210 may, for example, be implemented by programmable logic circuits.

A reference clock signal REFCLK and a feedback clock signal FBCLK are provided to inputs of phase frequency detector circuit 201. Phase frequency detector (PFD) 201 compares the phase and the frequency of feedback clock signal FBCLK to the phase and the frequency of clock signal REFCLK to generate phase error signals UPPF and DNPF. Phase error signals UPPF and DNPF are indicative of the differences between the phases and the frequencies of clock signals REFCLK and FBCLK.

Multiplexer circuits 202 include two 2-to-1 multiplexers. A LOCK signal is provided to an input of state machine 210. State machine 210 generates a select signal SEL that is provided to a select input of multiplexer circuits 202. At the start of normal operation of CDR circuit 200, state machine 210 generates the select signal SEL based only on the LOCK signal. The LOCK signal is asserted to begin the normal operation of CDR circuit 200. When the LOCK signal is initially asserted, state machine 210 drives the SEL signal to a logic state that causes multiplexer circuits 202 to provide error signals UPPF and DNPF to inputs of charge pump 204 as error signals UP and DN, respectively.

CDR circuit 200 has a phase-locked loop (PLL) circuit that includes PFD 201, multiplexer circuits 202, charge pump 204, low pass filter 205, VCO 206, and counter circuits 207-208. When multiplexer circuits 202 provide phase error signals UPPF and DNPF to inputs of charge pump 204 as error signals UP and DN, respectively, CDR circuit 200 is in lock-to-reference mode. In lock-to-reference mode, the PLL in CDR circuit 200 adjusts the phase and frequency of clock signal FBCLK to cause the phase and frequency of clock signal FBCLK to match the phase and frequency of reference clock signal REFCLK.

Charge pump circuit 204 converts the UP and DN error signals into an analog control voltage VCL. The control voltage VCL is provided to a control input of VCO circuit 206. Low pass filter 205 attenuates high frequency components of control voltage VCL.

VCO circuit 206 generates periodic output clock signals CLKV (e.g., 4 clock signals). VCO circuit 206 adjusts the phases and frequencies of clock signals CLKV based on changes in the voltage of control voltage VCL in lock-to-reference mode. The output clock signals CLKV of VCO circuit 206 are provided to inputs of L counter circuit 207. L counter circuit 207 generates clock signals CLKL based on clock signals CLKV. L counter circuit 207 divides the frequency of each of clock signals CLKV by a frequency division value to generate the frequency of each of clock signals CLKL. Clock signals CLKL are recovered clock signals. M counter circuit 208 generates clock signal FBCLK based on at least one of clock signals CLKL. M counter circuit 208 divides the frequency of at least one of clock signals CLKL by a frequency division value to generate feedback clock signal FBCLK.

The clock signals CLKL generated by L counter circuit 207 are provided to inputs of phase detector circuit 211, sampler circuit 213, and deserializer circuit 212. A differential input data signal DXP/DXN is provided to inputs of phase detector circuit 211. Phase detector circuit 211 compares the phase of differential input data signal DXP/DXN to the phases of clock signals CLKL. Clock signals CLKL may, for example, include 4 clock signals having relative phase offsets of 0°, 90°, 180°, and 270°. Phase detector circuit 211 generates phase error signals UPPD and DNPD that are indicative of the differences between the phase of the differential input data signal DXP/DXN and the phases of clock signals CLKL. Phase error signals UPPD and DNPD are provided to inputs of multiplexer circuits 202.

Data detection circuit 209 generates a data detection signal DET based on phase error signals UPPD and DNPD and two complementary clock signals CLKD and CLKDB. When CDR circuit 200 is in normal operation in a single-channel mode, state machine 210 generates the SEL signal based only on the DET signal generated by data detection circuit 209. After a rising edge in one of signals UPPD or DNPD, state machine 210 generates a logic state in the SEL signal that causes multiplexer circuits 202 to provide phase error signals UPPD and DNPD to inputs of charge pump 204 as error signals UP and DN, respectively.

When multiplexer circuits 202 provide the phase error signals UPPD and DNPD generated by phase detector circuit 211 to inputs of charge pump 204 as error signals UP and DN, respectively, CDR circuit 200 is in lock-to-data mode. In lock-to-data mode, VCO circuit 206 adjusts the phases of clock signals CLKV based on changes in the voltage of control voltage VCL that are generated based on the UP and DN signals. When CDR circuit 200 is in lock-to-data mode, CDR circuit 200 adjusts the phases of clock signals CLKV and CLKL based on changes in the phase of input data signal DXP/DXN.

Differential input data signal DXP/DXN is also provided to sampler circuit 213. Sampler circuit 213 samples the differential input data signal DXP/DXN in response to clock signals CLKL to generate an even sampled data signal DE and an odd sampled data signal DO. The DE and DO signals include data bits that are sampled in even and odd bit periods, respectively, of data signal DXP/DXN using clock signals CLKL. The sampled data signals DE and DO are provided to inputs of deserializer circuit 212. Clock signals CLKL are provided to additional inputs of deserializer circuit 212.

Deserializer circuit 212 converts the serial sampled data bits in each of signals DE and DO into parallel sampled data bits using one or more of clock signals CLKL. Deserializer circuit 212 outputs the parallel sampled data bits in parallel output data signals DATA. Deserializer circuit 212 also generates clock signals CLKD and CLKDB based on one or more of clock signals CLKL. Clock signal CLKDB is the inverse of clock signal CLKD. Clock signals CLKD and CLKDB are 180° degrees out of phase with each other.

Figure 3:
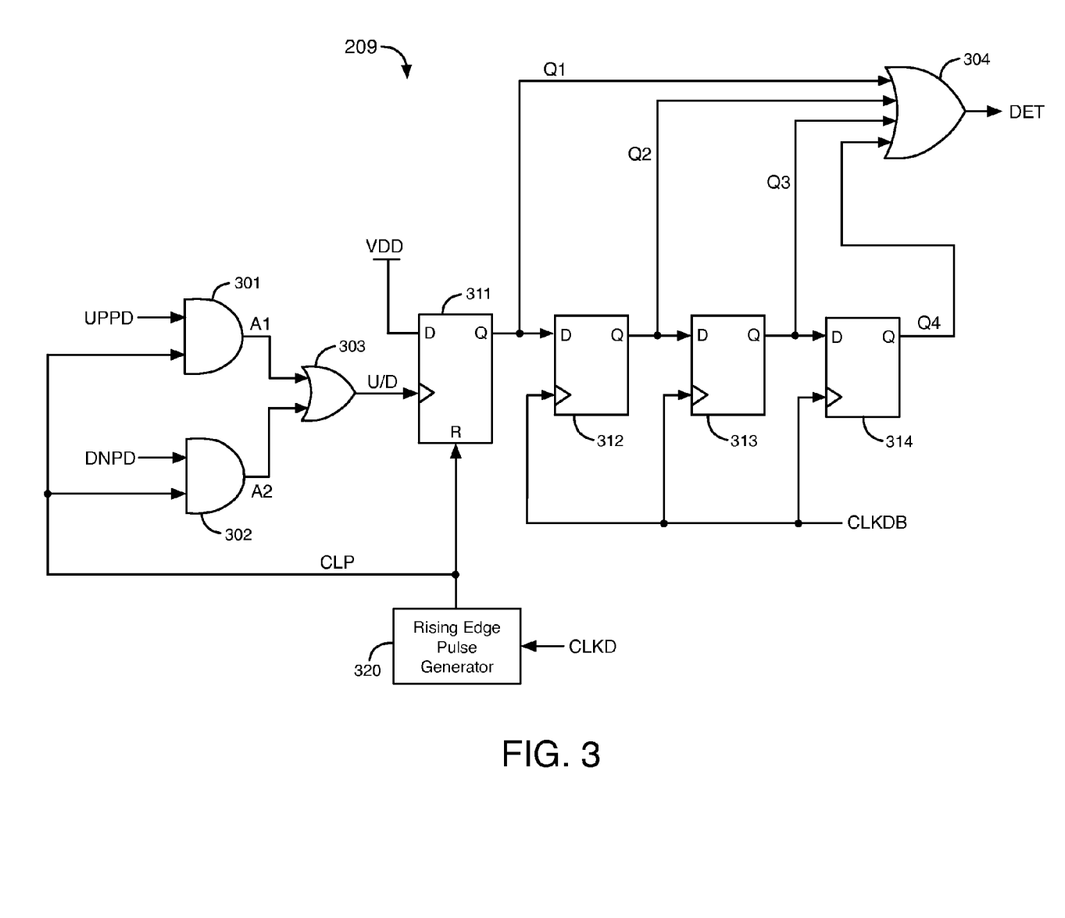
FIG. 3 illustrates a diagram of data detection circuit, according to an embodiment of the present invention.

FIG. 3 illustrates a diagram of data detection circuit 209, according to an embodiment of the present invention. Data detection circuit 209 includes AND logic gate circuits 301-302, OR logic gate circuits 303-304, D flip-flop circuits 311-314, and rising edge pulse generator circuit 320.

The UPPD phase error signal generated by phase detector circuit 211 is provided to an input of AND gate circuit 301. The DNPD phase error signal generated by phase detector circuit 211 is provided to an input of AND gate circuit 302. Clock signal CLKD generated by deserializer circuit 212 is provided to an input of rising edge pulse generator circuit 320. Rising edge pulse generator circuit 320 generates a logic low pulse in signal CLP in response to each rising edge in clock signal CLKD. Rising edge pulse generator circuit 320 causes each logic low pulse generated in signal CLP to have a short duration relative to the period of clock signal CLKD.

Signal CLP is provided to an input of each of AND gate circuits 301-302. Signal CLP is also provided to the reset input R of flip-flop circuit 311. Clock signal CLKDB generated by deserializer circuit 212 is provided to a clock input of each of flip-flop circuits 312-314.

AND gate circuit 301 generates an output signal A1 by performing a logic AND function based on the logic states of input signals UPPD and CLP. AND gate circuit 302 generates an output signal A2 by performing a logic AND function based on the logic states of input signals DNPD and CLP. Signals A1 and A2 are provided to inputs of OR gate circuit 303. OR gate circuit 303 generates an output signal U/D by performing a logic OR function based on the logic states of signals A1 and A2. Signal U/D is provided to the clock input of flip-flop circuit 311. A supply voltage VDD is provided to the D input of flip-flop circuit 311.

Flip-flop circuits 311-314 generate output signals Q1-Q4, respectively, at their Q outputs. Signals Q1-Q4 are provided to inputs of OR gate circuit 304. OR gate circuit 304 generates data detection signal DET by performing a logic OR function based on the logic states of signals Q1-Q4.

Figure 4:
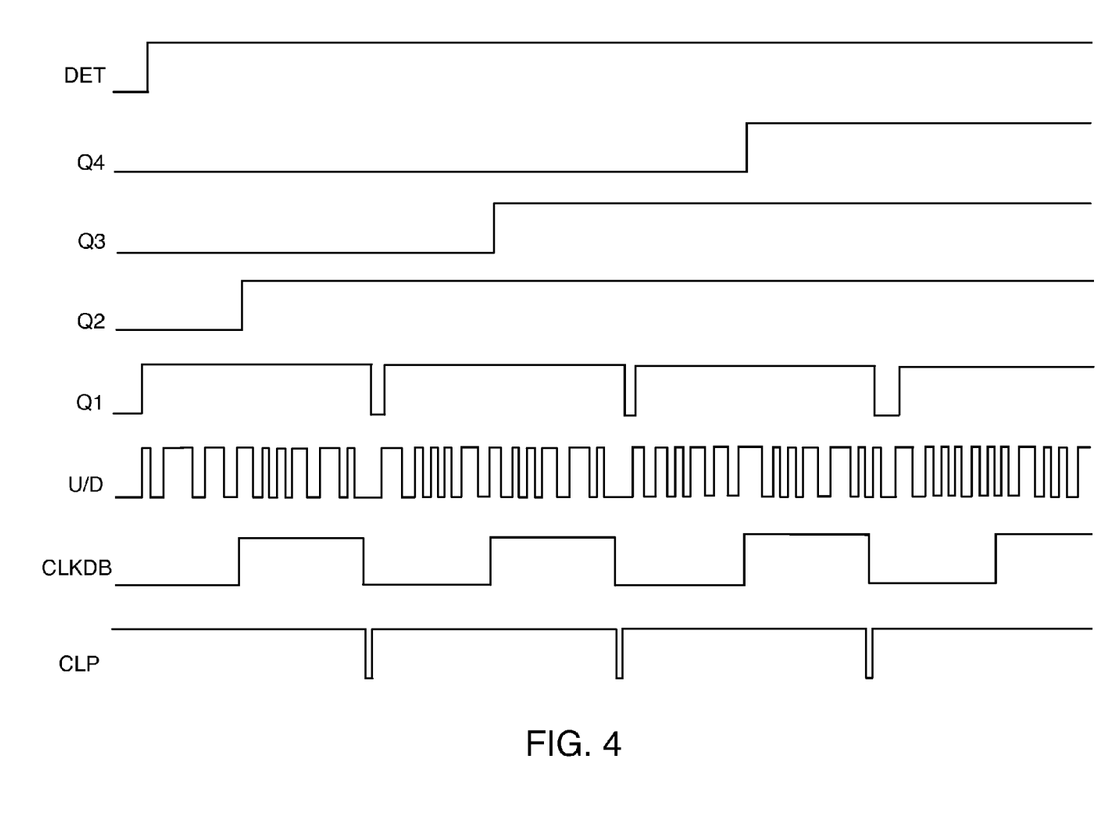
FIG. 4 illustrates examples of waveforms for some of the signals in the data detection circuit of FIG. 3, according to an embodiment of the present invention.

FIG. 4 illustrates examples of waveforms for signals DET, Q1-Q4, U/D, CLP, and CLKDB, according to an embodiment of the present invention. The exemplary waveforms shown in FIG. 4 illustrate the operation of data detection circuit 209.

As shown in FIG. 4, signal CLP is in a logic high state for most of its period, and signal CLP has short duration logic low pulses that occur after rising edges in clock signal CLKD. Also, as shown in FIG. 4, clock signal CLKDB has a 50% duty cycle.

Phase detector circuit 211 generates logic high pulses in one or both of phase error signals UPPD and DNPD in response to receiving data in differential input data signal DXP/DXN. AND gate circuits 301-302 and OR gate circuit 303 generate logic high pulses in the U/D signal in response to logic high pulses in either of the UPPD and DNPD signals that occur when signal CLP is in a logic high state.

The differential input data signal DXP/DXN contains no data when both of input data signals DXP and DXN are in logic low states during the dead times. Phase detector circuit 211 causes both of phase error signals UPPD and DNPD to remain in logic low states in response to receiving no data in differential input data signal DXP/DXN during the dead times.

The supply voltage VDD at the D input of flip-flop circuit 311 has a constant voltage that indicates a logic high state. Flip-flop circuit 311 generates a rising edge in its output signal Q1 in response to the first rising edge in signal U/D, as shown in FIG. 4, by providing the logic high state at its D input to its Q output. In response to the next rising edge in clock signal CLKDB (i.e., the first rising edge in CLKDB shown in FIG. 4), flip-flop circuit 312 generates a rising edge in its output signal Q2 by providing the logic high state in signal Q1 at its D input to its Q output. Flip-flop circuit 311 generates a falling edge in its output signal Q1 in response to each rising edge received in signal CLP at its reset input R.

In response to the second rising edge in clock signal CLKDB shown in FIG. 4, flip-flop circuit 313 generates a rising edge in its output signal Q3 by providing the logic high state in signal Q2 at its D input to its Q output. In response to the third rising edge in clock signal CLKDB shown in FIG. 4, flip-flop circuit 314 generates a rising edge in its output signal Q4 by providing the logic high state in signal Q3 at its D input to its Q output.

OR gate circuit 304 generates a rising edge in the DET signal in response to the rising edge in the Q1 output signal of flip-flop circuit 311. OR gate circuit 304 causes the DET signal to remain in a logic high state based on the logic high states in signals Q2-Q4 after each of the falling edges in signal Q1, as shown in FIG. 4. Thus, the falling edges in signal Q1 do not cause falling edges in signal DET while at least one of signals Q2-Q4 is in a logic high state. Flip-flop circuits 311-314 cause OR gate circuit 304 to maintain the DET signal in a logic high state while phase detector circuit 211 continues to generate logic high pulses in phase error signals UPPD and DNPD.

When phase detector circuit 211 no longer receives data in differential input data signal DXP/DXN, phase detector circuit 211 causes both of phase error signals UPPD and DNPD to be in logic low states. Phase detector circuit 211 causes phase error signals UPPD and DNPD to remain in logic low states until phase detector circuit 211 receives data in differential input data signal DXP/DXN again.

In response to phase detector circuit 211 causing both of phase error signals UPPD and DNPD to remain in logic low states when differential input data signal DXP/DXN does not contain data, AND gate circuits 301-302 and OR gate circuit 303 cause signal U/D to remain in a logic low state. After flip-flop circuit 311 is reset by signal CLP, flip-flop circuit 311 causes signal Q1 to remain in a logic low state until another rising edge occurs in the U/D signal. If signal Q1 remains in a logic low state for at least the next three rising edges of clock signal CLKDB, flip-flop circuits 312-314 generate falling edges in their output signals Q2-Q4, respectively. Thus, the logic low state in signal Q1 propagates to signals Q2-Q4 in response to the subsequent rising edges in clock signal CLKDB. In response to a falling edge occurring in signal Q4 when signals Q1-Q3 are already in logic low states, OR gate circuit 304 generates a falling edge in the DET signal. The frequency of clock signals CLKD and CLKDB is selected to provide adequate setup and hold times for flip-flop circuits 311-314.

Figure 5:
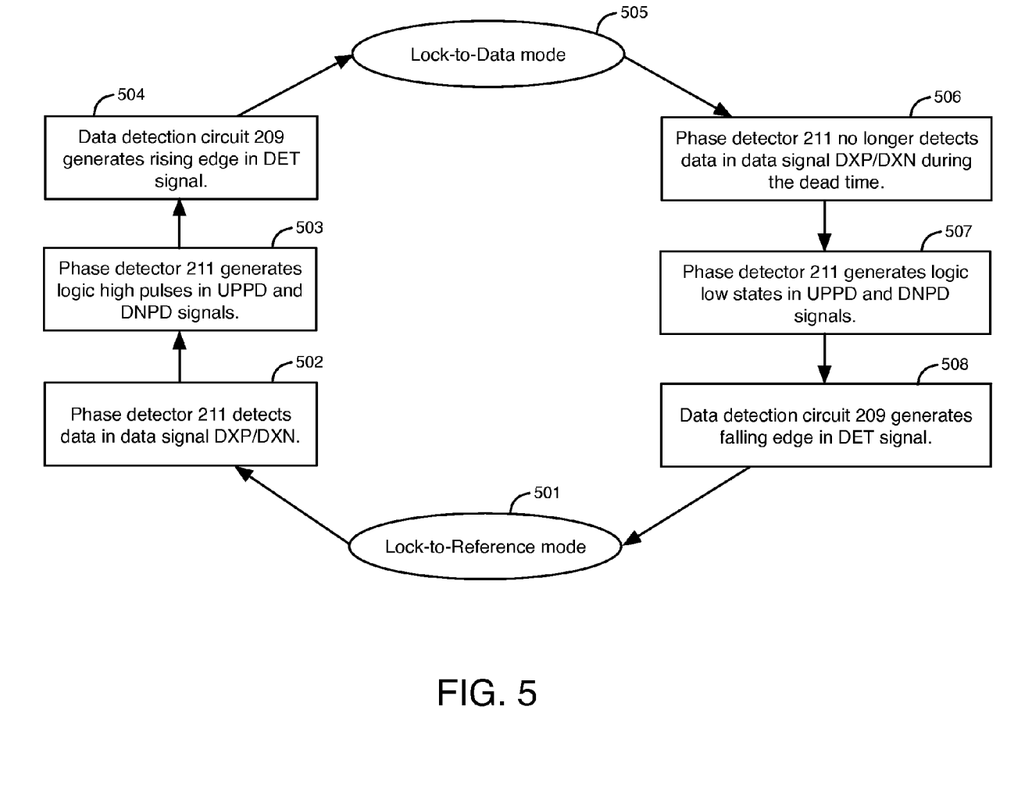
FIG. 5 is a flow chart that illustrates operations of the CDR circuit of FIG. 2, according to an embodiment of the present invention.

FIG. 5 is a flow chart that illustrates operations of CDR circuit 200, according to an embodiment of the present invention. As described above, CDR circuit 200 enters lock-to-reference mode 501 after the LOCK signal is initially asserted. CDR circuit 200 remains in lock-to-reference mode 501 until phase detector circuit 211 detects data in differential input data signal DXP/DXN. In operation 502, phase detector circuit 211 detects data in differential input data signal DXP/DXN. In operation 503, phase detector circuit 211 generates logic high pulses in one or both of phase error signals UPPD and DNPD in response to detecting data in differential input data signal DXP/DXN.

In operation 504, data detection circuit 209 generates a rising edge in signal DET in response to the logic high pulses in at least one of the phase error signals UPPD and DNPD, as described above with respect to FIGS. 3-4. In response to the rising edge in the DET signal, state machine 210 generates a logic state in the SEL signal that causes multiplexer circuits 202 to provide error signals UPPD and DNPD to the inputs of charge pump circuit 204 as signals UP and DN as described above with respect to FIG. 2. CDR circuit 200 then enters the lock-to-data mode 505.

CDR circuit 200 remains in lock-to-data mode 505 until phase detector circuit 211 does not detect data in differential input data signal DXP/DXN. In operation 506, phase detector circuit 211 no longer detects data in differential input data signal DXP/DXN during the dead time. In operation 507, phase detector circuit 211 generates logic low states in each of the phase error signals UPPD and DNPD. In operation 508, data detection circuit 209 generates a falling edge in signal DET in response to the logic low states in signals UPPD and DNPD, as described above with respect to FIGS. 3-4. In response to the falling edge in the DET signal, state machine 210 generates a logic state in the SEL signal that causes multiplexer circuits 202 to provide phase error signals UPPF and DNPF to the inputs of charge pump circuit 204 as signals UP and DN as described above with respect to FIG. 2. CDR circuit 200 then enters lock-to-reference mode 501 again. CDR circuit 200 remains in lock-to-reference mode 501 until phase detector circuit 211 detects data in differential input data signal DXP/DXN again in operation 502. The process of FIG. 5 then repeats. Thus, CDR circuit 200 is able to switch between lock-to-data and lock-to-reference modes in response to a data signal that is transmitted based on the GPON standard.

Figure 6:
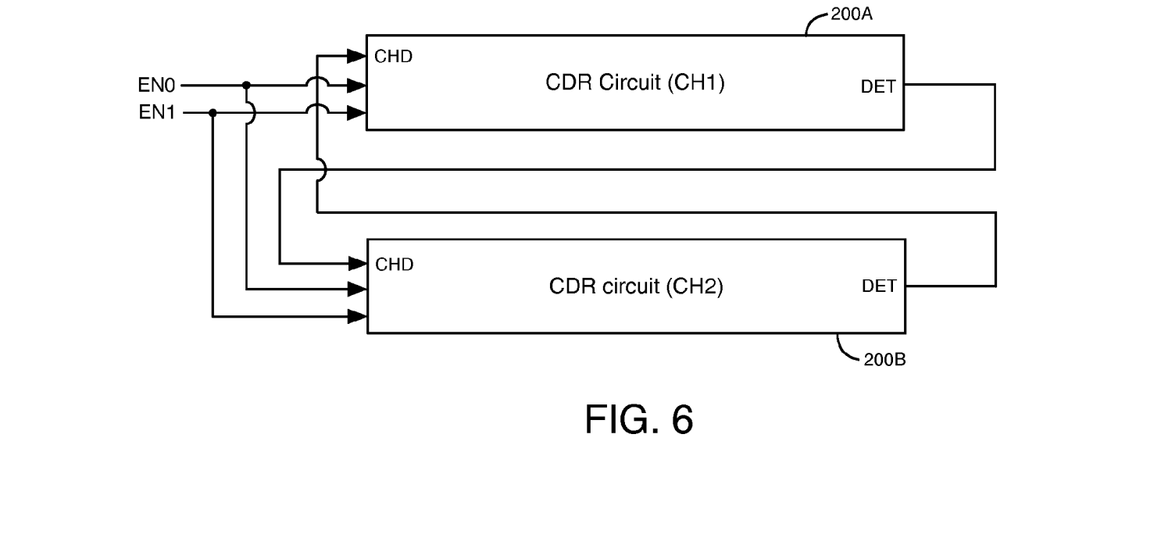
FIG. 6 illustrates a diagram of two clock data recovery (CDR) circuits that are configurable to operate in single channel mode or in dual channel mode, according to an embodiment of the present invention.

FIG. 6 illustrates a diagram of two clock data recovery (CDR) circuits 200A-200B that are configurable to operate in single channel mode or in dual channel mode, according to an embodiment of the present invention. Each of CDR circuits 200A-200B includes the circuit structure of CDR circuit 200 shown in FIG. 2. CDR circuit 200A is a first channel (CH1) and CDR circuit 200B is a second channel (CH2).

Two enable signals EN0 and EN1 are provided to inputs of each of CDR circuits 200A-200B. Enable signals EN0 and EN1 may, for example, be provided to inputs of state machine 210 in each of CDR circuits 200A-200B. Enable signals EN0 and EN1 determine if CDR circuits 200A-200B are in single channel mode or in dual channel mode. When enable signals EN0-EN1 cause CDR circuits 200A-200B to operate in single channel mode, the state machines 210 in CDR circuits 200A-200B are not responsive to the CHD signals, and CDR circuits 200A-200B function as described above with respect to FIGS. 2-5.

As shown in FIG. 6, the DET signal generated by data detection circuit 209 in CDR circuit 200A is provided to state machine 210 in CDR circuit 200B as signal CHD. Also, the DET signal generated by data detection circuit 209 in CDR circuit 200B is provided to state machine 210 in CDR circuit 200A as signal CHD. The state machines 210 in CDR circuits 200A-200B are responsive to the CHD signal received from the other channel in the dual channel mode, as described below with respect to FIG. 7.

Figure 7:
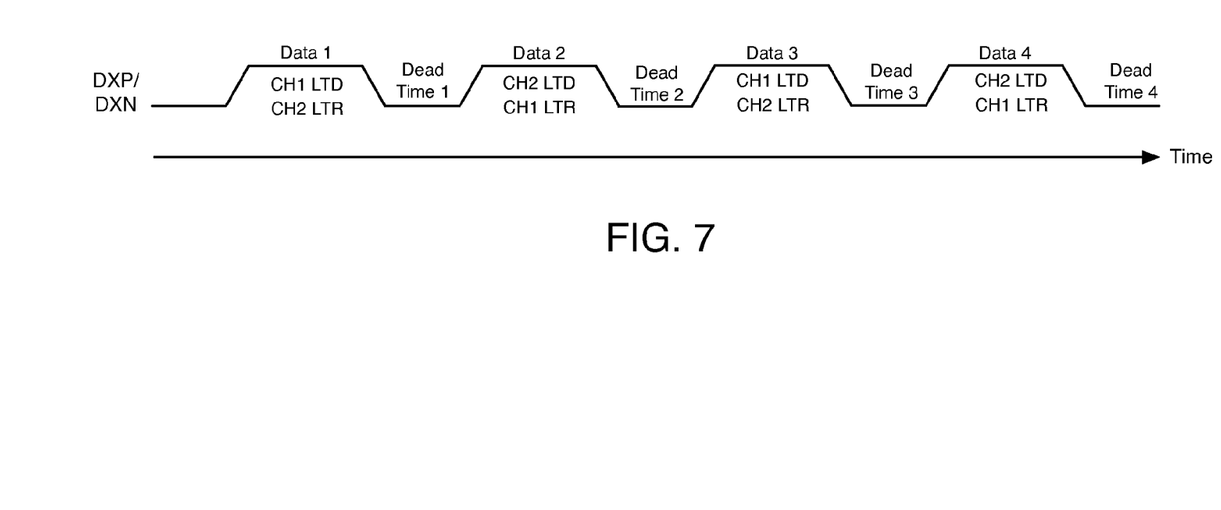
FIG. 7 is a timing diagram that illustrates an example of a simplified waveform for the differential input data signal provided to the channels shown in FIG. 6, according to an embodiment of the present invention.

FIG. 7 is a timing diagram that illustrates an example of a simplified waveform for the differential input data signal DXP/DXN, according to an embodiment of the present invention. FIG. 7 illustrates the operation of CDR circuits 200A-200B in dual channel mode. When enable signals EN0-EN1 cause CDR circuits 200A-200B to operate in dual channel mode, CDR circuits 200A-200B function as shown in and described below with respect to FIG. 7.

Differential input data signal DXP/DXN contains data in time periods Data 1, Data 2, Data 3, and Data 4 shown in FIG. 7. Differential input data signal DXP/DXN does not contain data during Dead time 1, Dead Time 2, Dead Time 3, and Dead Time 4 shown in FIG. 7. During the dual channel mode, the phase detector circuit 211 in CDR circuit (CH1) 200A is enabled, and the phase detector circuit 211 in CDR circuit (CH2) 200B is disabled.

In dual channel mode, if CDR circuit 200A is in lock-to-data (LTD) mode, then CDR circuit 200B is in lock-to-reference (LTR) mode. In dual channel mode, if CDR circuit 200A is in LTR mode, then CDR circuit 200B is in LTD mode. When CDR circuit 200B is in lock-to-data mode, the VCO circuit 206 in CDR circuit 200B is responsive to the output signals of the phase detector circuit 211 in CDR circuit 200A.

At the start of each of time periods Data 1 and Data 3, CDR circuit 200A (CH1) switches to LTD mode. During time periods Data 1, Data 3, Dead Time 1, and Dead Time 3, CDR circuit 200A is in LTD mode. When CDR circuit 200A is in LTD mode, the data detection circuit 209 in CDR circuit 200A generates a logic state in its output signal DET that causes CDR circuit 200B (CH2) to be in LTR mode. The DET signal generated by data detection circuit 209 in CDR circuit 200A is provided to state machine 210 in CDR circuit 200B as signal CHD.

At the start of each of time periods Data 2 and Data 4, CDR circuit 200B (CH2) switches to LTD mode. During time periods Data 2, Data 4, Dead Time 2, and Dead Time 4, CDR circuit 200B is in LTD mode. When CDR circuit 200B is in LTD mode, the data detection circuit 209 in CDR circuit 200B generates a logic state in its output signal DET that causes CDR circuit 200A (CH1) to be in LTR mode. The DET signal generated by data detection circuit 209 in CDR circuit 200B is provided to state machine 210 in CDR circuit 200A as signal CHD.

While CDR circuit 200A is in LTD mode in each of Dead Time 1 and Dead Time 3, the frequencies of the clock signals CLKL in CDR circuit 200A drift, because phase detector circuit 211 does not generate logic high pulses in the UPPD and DNPD signals when differential input data signal DXP/DXN does not contain data. Signal CHD from CDR circuit 200B causes CDR circuit 200A to be in LTR mode during time periods Data 2 and Data 4 to align the frequency and phase of clock signal FBCLK with the frequency and phase of reference clock signal REFCLK in CDR circuit 200A.

While CDR circuit 200B is in LTD mode in each of Dead Time 2 and Dead Time 4, the frequencies of the clock signals CLKL in CDR circuit 200B drift, because phase detector circuit 211 is not generating logic high pulses in the UPPD and DNPD signals. Signal CHD from CDR circuit 200A causes CDR circuit 200B to be in LTR mode during time period Data 3 (and any data period after Dead Time 4) to align the frequency and phase of clock signal FBCLK with the frequency and phase of reference clock signal REFCLK in CDR circuit 200B.

Figure 8:
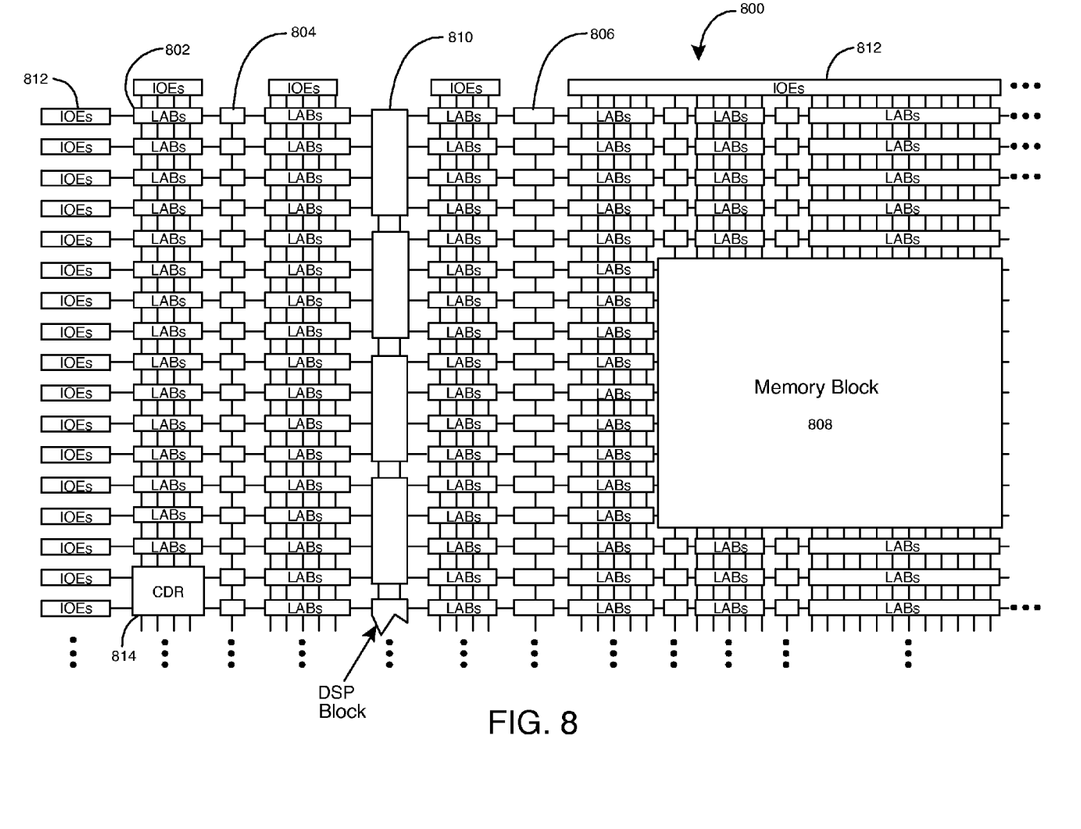
FIG. 8 is a simplified partial block diagram of a field programmable gate array (FPGA) that can include aspects of the present invention.

FIG. 8 is a simplified partial block diagram of a field programmable gate array (FPGA) 800 that can include aspects of the present invention. FPGA 800 is merely one example of an integrated circuit that can include features of the present invention. It should be understood that embodiments of the present invention can be made in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 800 includes a two-dimensional array of programmable logic array blocks (or LABs) 802 that are interconnected by a network of column and row interconnect conductors of varying length and speed. LABs 802 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 800 also includes a distributed memory structure including random access memory (RAM) blocks of varying sizes provided throughout the array. The RAM blocks include, for example, blocks 804, blocks 806, and block 808. These memory blocks can also include shift registers and first-in-first-out (FIFO) buffers.

FPGA 800 further includes digital signal processing (DSP) blocks 810 that can implement, for example, multipliers with add or subtract features. Input/output elements (IOEs) 812 located, in this example, around the periphery of the chip, support numerous single-ended and differential input/output standards. IOEs 812 include input and output buffers that are coupled to pads of the integrated circuit. The pads are external terminals of the FPGA die that can be used to route, for example, input signals, output signals, and supply voltages between the FPGA and one or more external devices. FPGA 800 also has a clock and data recovery (CDR) circuit 814, such as CDR circuit 200. It is to be understood that FPGA 800 is described herein for illustrative purposes only and that the present invention can be implemented in many different types of integrated circuits.

Figure 9:
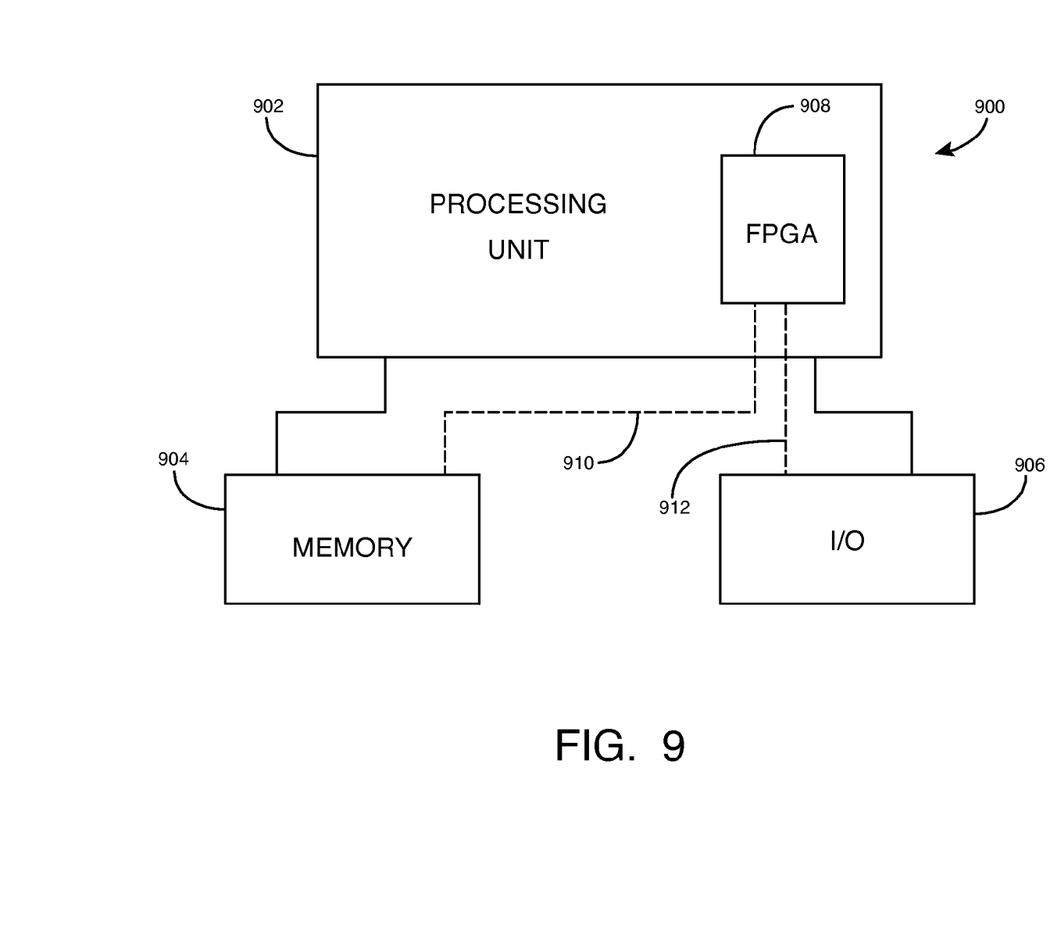
FIG. 9 shows a block diagram of an exemplary digital system that can embody techniques of the present invention.

The present invention can also be implemented in a system that has an FPGA as one of several components. FIG. 9 shows a block diagram of an exemplary digital system 900 that can embody techniques of the present invention. System 900 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 900 can be provided on a single board, on multiple boards, or within multiple enclosures.

System 900 includes a processing unit 902, a memory unit 904, and an input/output (I/O) unit 906 interconnected together by one or more buses. According to this exemplary embodiment, an FPGA 908 is embedded in processing unit 902. FPGA 908 can serve many different purposes within the system of FIG. 9. FPGA 908 can, for example, be a logical building block of processing unit 902, supporting its internal and external operations. FPGA 908 is programmed to implement the logical functions necessary to carry on its particular role in system operation. FPGA 908 can be specially coupled to memory 904 through connection 910 and to I/O unit 906 through connection 912.

Processing unit 902 can direct data to an appropriate system component for processing or storage, execute a program stored in memory 904, receive and transmit data via I/O unit 906, or other similar functions. Processing unit 902 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 908 can control the logical operations of the system. As another example, FPGA 908 acts as a reconfigurable processor that can be reprogrammed as needed to handle a particular computing task. Alternatively, FPGA 908 can itself include an embedded microprocessor. Memory unit 904 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
a phase detector circuit to generate a first phase detection signal based on a data signal and a first periodic signal;
a phase frequency detector circuit to generate a second phase detection signal based on a second periodic signal and a third periodic signal;
a data detection circuit to generate a data detection signal based on the first phase detection signal;
a multiplexer circuit to provide one of the first and the second phase detection signals as a selected signal based on the data detection signal; and
a periodic signal generation circuit to cause adjustments to phases of the first and the second periodic signals based on the selected signal.

2. The circuit of claim 1, wherein the data detection circuit generates the data detection signal to cause the multiplexer circuit to provide the first phase detection signal as the selected signal during a lock-to-data mode when the data signal contains data.

3. The circuit of claim 2, wherein the data detection circuit generates the data detection signal to cause the multiplexer circuit to provide the second phase detection signal as the selected signal during a lock-to-reference mode during a dead time in the data signal.

4. The circuit of claim 1, wherein the circuit is a clock data recovery circuit in an integrated circuit, and the data signal is transmitted based on a gigabit passive optical network (GPON) standard.

5. The circuit of claim 1, wherein the data detection circuit comprises a first storage circuit to generate a first stored signal based on the first phase detection signal.

6. The circuit of claim 5, wherein the data detection circuit further comprises:
a second storage circuit to generate a second stored signal based on the first stored signal.

7. The circuit of claim 6, wherein the data detection circuit further comprises:
a third storage circuit to generate a third stored signal based on the second stored signal;
a fourth storage circuit to generate a fourth stored signal based on the third stored signal; and
a logic gate circuit to generate the data detection signal based on the first, the second, the third, and the fourth stored signals.

8. The circuit of claim 1, wherein the data detection circuit comprises:
  a plurality of delay elements to generate a series of delayed detection signals based on the first phase detection signal, and
  a logic gate circuit to generate the data detection signal based on the series of delayed detection signals.

9. The circuit of claim 5, wherein the phase detector circuit generates a third phase detection signal based on the data signal and the first periodic signal, and wherein the data detection circuit further comprises:
  logic circuitry to generate a logic signal based on the first and the third phase detection signals, wherein the first storage circuit generates the first stored signal based on the logic signal.

10. The circuit of claim 1 further comprising:
  a charge pump circuit to generate a control signal based on the selected signal;
  a loop filter circuit to filter the control signal, wherein the periodic signal generation circuit is an oscillator circuit that varies a phase and a frequency of a fourth periodic signal based on the control signal; and
  a frequency divider circuit to generate the first periodic signal based on the fourth periodic signal, wherein the second periodic signal is generated based on the fourth periodic signal.

11. The circuit of claim 1 further comprising:
  a state machine to generate a select signal based on the data detection signal, wherein the select signal is provided to the multiplexer circuit, and wherein the multiplexer circuit provides one of the first and the second phase detection signals as the selected signal based on the select signal.

12. The circuit of claim 11, wherein the circuit is a first clock data recovery circuit, and wherein the state machine causes the multiplexer circuit to provide the second phase detection signal as the selected signal during a lock-to-reference mode when the data signal contains data in response to a control signal generated by a second clock data recovery circuit.

13. A method comprising:
  generating a first phase detection signal based on a data signal and a first periodic signal;
  generating a first value of a data detection signal if the first phase detection signal indicates that the data signal contains data;
  varying the first periodic signal based on the first value of the data detection signal;
  generating a second value of the data detection signal if the first phase detection signal indicates a dead time in the data signal; and
  varying the first periodic signal based on the second value of the data detection signal.

14. The method of claim 13 further comprising:
  generating a second phase detection signal based on a second periodic signal and a third periodic signal;
  selecting one of the first and the second phase detection signals as a selected signal based on the data detection signal; and
  varying the phase of the second periodic signal based on the selected signal.

15. The method of claim 13, wherein generating a first value in a data detection signal if the first phase detection signal indicates that the data signal contains data comprises storing a first stored signal based on the first phase detection signal and generating the data detection signal based on the first stored signal.

16. The method of claim 15 wherein generating a first value in a data detection signal if the first phase detection signal indicates that the data signal contains data further comprises generating a reset signal that periodically clears the first stored signal, storing a second stored signal based on the first stored signal, and generating the data detection signal based on the first and the second stored signals.

17. The method of claim 13, wherein generating a first phase detection signal based on a data signal and a first periodic signal comprises generating the first phase detection signal based on the data signal and the first periodic signal using a phase detector circuit;
  wherein generating first and second values of a data detection signal comprises generating the first and the second values of the data detection signal using a data detection circuit; and
  wherein varying the first periodic signal based on the first and the second values of the data detection signal comprises varying the first periodic signal based on the first and the second values of the data detection signal using a periodic signal generation circuit.

18. A circuit comprising:
  a phase detector circuit to generate a first phase detection signal based on a data signal and a first periodic signal;
  a phase frequency detector circuit to generate a second phase detection signal based on a second periodic signal and a third periodic signal;
  a data detection circuit to generate a data detection signal based on the first phase detection signal, wherein an error signal is generated based on the first phase detection signal if the data detection signal indicates that the data signal comprises data, and wherein the error signal is generated based on the second phase detection signal if the data detection signal indicates a dead time in the data signal; and
  a periodic signal generation circuit to adjust the first and the second periodic signals based on the error signal.

19. The circuit of claim 18, wherein a multiplexer circuit generates the error signal based on the first phase detection signal if the data detection signal indicates that the data signal comprises data, and wherein the multiplexer circuit generates the error signal based on the second phase detection signal if the data detection signal indicates the dead time in the data signal.

20. The circuit of claim 18, wherein the data detection circuit comprises a first storage circuit to generate a first stored signal based on the first phase detection signal, a second storage circuit to generate a second stored signal based on the first stored signal, and a logic gate circuit to generate the data detection signal based on the first and the second stored signals.

21. The circuit of claim 18, wherein the data detection circuit comprises:
  a plurality of delay elements to generate a series of delayed detection signals based on the first phase detection signal; and
  a logic gate circuit to generate the data detection signal based on the series of delayed detection signals.

* * * * *